United States Patent [19]

Smith

[11] Patent Number: 5,151,758
[45] Date of Patent: Sep. 29, 1992

[54] PLANAR-DOPED VALLEY FIELD EFFECT TRANSISTOR (PDVFET)

[75] Inventor: Thane Smith, Middletown, Md.

[73] Assignee: Comasat, Clarksburg, Md.

[21] Appl. No.: 657,918

[22] Filed: Feb. 20, 1991

[51] Int. Cl.$^5$ .................. H01L 29/161; H01L 29/20; H01L 21/203; H01L 21/20
[52] U.S. Cl. ....................... 357/22; 357/16; 357/23.2; 437/105; 437/126; 437/176
[58] Field of Search ............ 357/22 A, 22 I, 16, 357/23.2; 437/105, 126, 176

[56] References Cited
U.S. PATENT DOCUMENTS
4,882,609 11/1989 Schubert et al. ............... 357/16

Primary Examiner—Rolf Hille
Assistant Examiner—Wael Fahmy
Attorney, Agent, or Firm—Sughrue, Mion, Zinn, Macpeak & Seas

[57] ABSTRACT

A planar doped valley field effect transistor (PDVFET), which positions more than one two-dimensional electron gas (2DEG) layer within a homo-structure (GaAs), in order to improve the FET's power output. The FET includes two 2DEG donor planes with an undoped GaAs layer therebetween, and a n-doped GaAs layer on the other side of each donor plane. The FET also includes a 2DEG acceptor plane below the n-doped GaAs layer, which is furthest from the contacts. This 2DEG plane combination forms a deep and wide valley in the FET's conduction band, which improves the FET's power output.

12 Claims, 5 Drawing Sheets

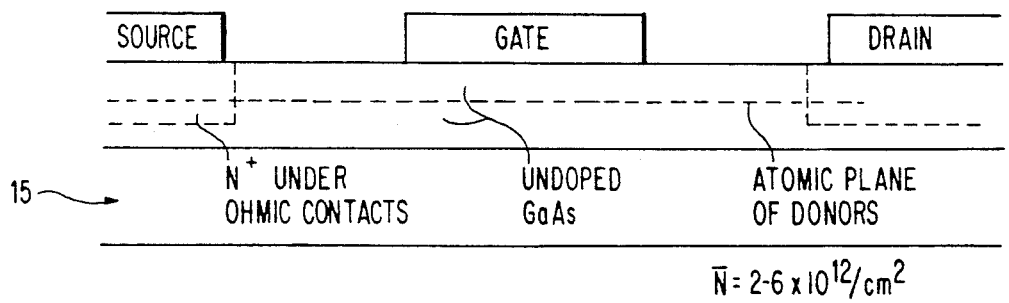
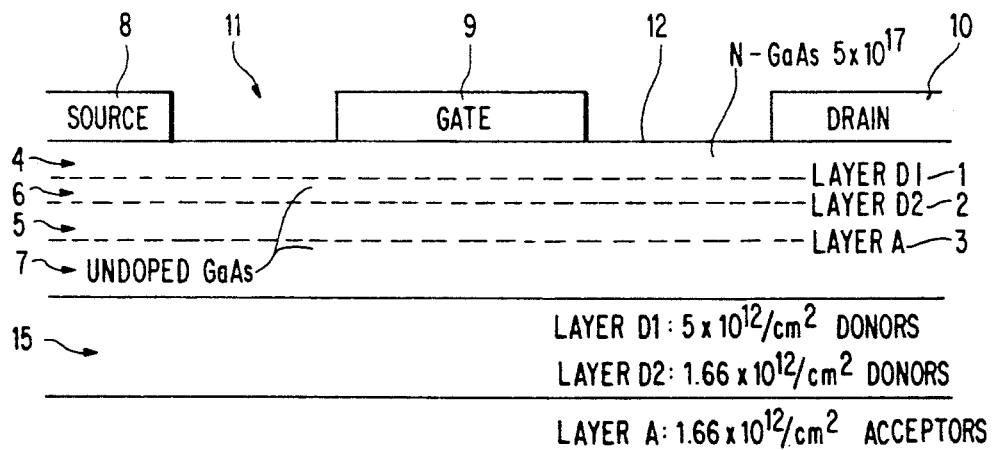

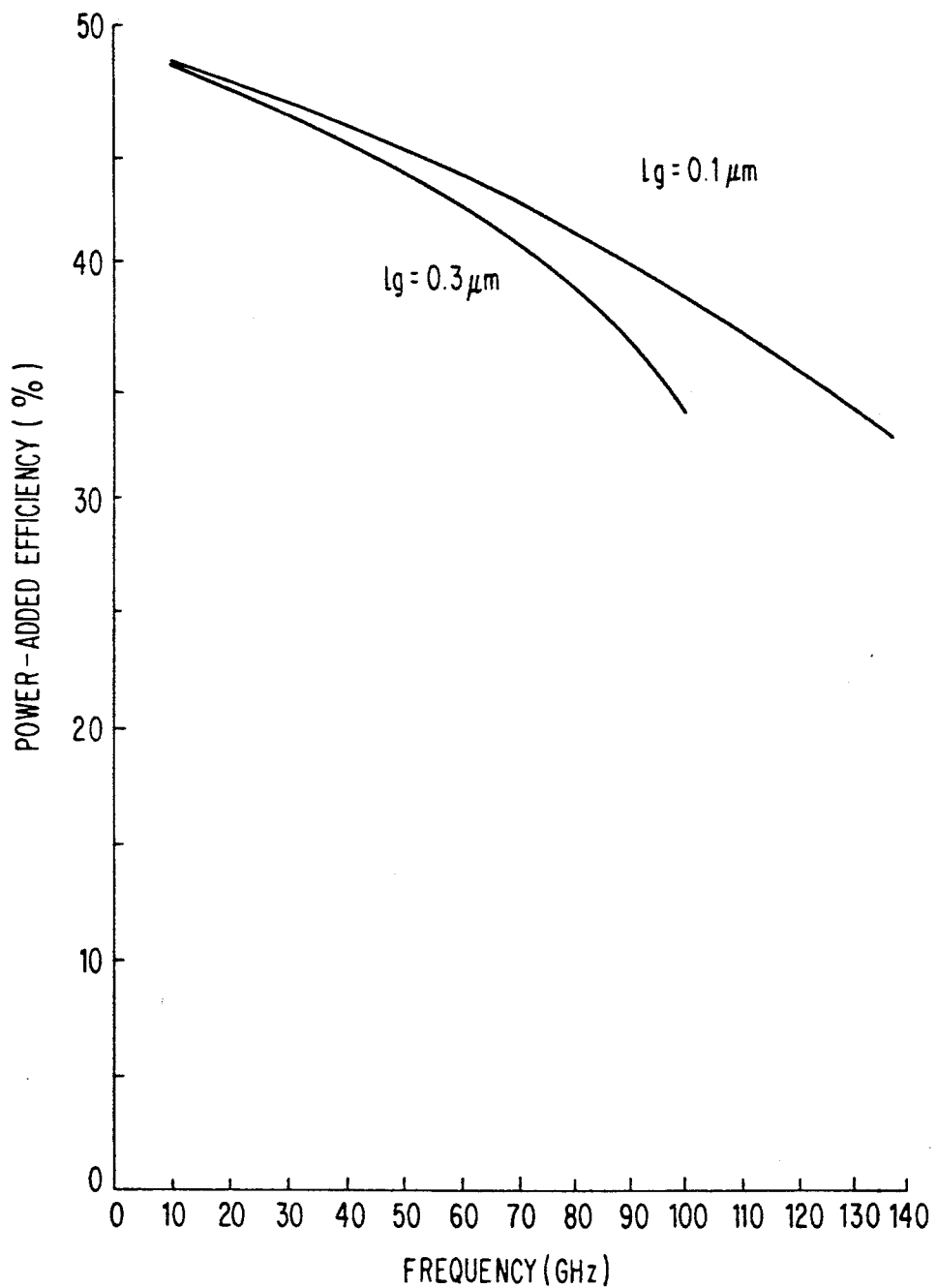

PLANAR-DOPED VALLEY FIELD EFFECT TRANSISTOR (PDVFET)

BACKGROUND OF THE INVENTION

This invention is directed to the development of a planar-doped valley FET as an alternative to a high electron mobility transistor (HEMT) and as an improvement upon a delta-doped FET.

High electron mobility transistors consist of a heterostructure, within which a two dimensional electron gas plane is interposed. This two dimensional electron gas (2DEG) provides high electron mobility at low temperatures. The high transconductance associated with HEMT's also contributes to high gain. However, one disadvantage of these transistors is that electron mobility decreases at fields over 100 volts/cm, which results in decreased power gain at high biasing voltages. Another disadvantage is that the active channel within HEMT's includes a hetero-junction which is difficult to fabricate.

As an alternative to the hetero-structure, a delta-doped FET has been proposed which includes a homo-structure within which the 2DEG is placed. This FET includes delta-doped layer incorporated, via molecular beam epitaxy (MBE) techniques, into a gallium arsenide (GaAs) epitaxial layer. This delta-doped layer creates a potential well in which a 2DEG layer can exist. The impurity atoms remain localized within the 2DEG, which functions as the conduction channel. This also changes the energy-band diagram for the FET. More specifically, the resulting conduction band (C-band) is V-shaped as shown in FIG. 2a, wherein the C-band energy level drops below the Fermi level at the 2DEG layer. The V-shaped valley (also referred to hereinafter as the potential well) of a delta-doped FET (FIG. 2a), differs from a MESFET (FIG. 2b) or a HEMT (FIG. 2c), in that the delta-doped FET's C-band depends linearly (on the gate side of the potential well) upon the spatial coordinate z (the distance below the gate), whereas the MESFET and the HEMT exhibit a quadratic dependence upon z. This difference primarily depends upon the fact that MESFET's and HEMT's have constant doping concentrations below the gate (i.e. within the layer between the gate and 2DEG). In contrast, the GaAs layers on either side of the 2DEG of the delta-doped FET are undoped.

As a consequence the delta-doped FET offers advantages such as a high and tightly confined carrier concentration within the 2DEG, a high gate breakdown voltage, a desirable proximity of the 2DEG and the gate, and a high transconductance.

Delta-doped FET's achieve higher maximum carrier concentration within the 2DEG layer than HEMT's. The maximum donor concentration within a delta-doped FET is determined by the equation $N^{2D}_D = (\epsilon/q)E_{av}$, wherein $E_{av}$ equals the avalanche breakdown field, $\epsilon$ is the permittivity of the semiconductor, and q is the charge. Assuming the $E_{av}$ equals approximately $6-7 \times 10^5$ volts/cm, the maximum planar donor concentration is $5 \times 10^{12}$ cm$^2$. This concentration allows a carrier concentration which is significantly higher than the carrier concentration in single-channel HEMT's.

Delta-doped FETs exhibit a higher breakdown voltage than MESFET's or HEMT's, since the maximum electric field for a reverse bias delta FET is given by the equation $E_{max} = (1 \div d)(\phi_B - V)$, wherein $\phi_B$ represents the Shottky barrier, d represents the depletion width of the delta FET, and V represents the gate-source bias voltage being applied. This equation differs from the conventional MESFET, since the maximum electric field for a conventional MESFET is given by the equation $E_{max} = (2 \div d)(\phi_B - V)$. Thus, when the electrical field is at a maximum $E_{max}$, the maximum breakdown voltage V within the delta FET will be higher than that of the MESFET having the same transconductance. HEMTs designed with the same transconductance as a MESFET, and having uniform doping in the AlGaAs layer between the gate and heterojunction, will have the same breakdown voltage as a MESFET. Typically, however, HEMTs are designed for higher transconductance than can be obtained in MESFETs, and consequently have a lower breakdown voltage.

Concerning the electron mobility, in a delta-doped FET using gallium arsenide as the homo-structure, electrons remain close to their parent donor impurities in real space due to electrostatic attraction. Therefore, delta-doped gallium arsenide layers have lower mobility than undoped gallium arsenide layers. The delta-doped gallium arsenide layers commonly have mobilities at approximately 3000 cm$^2$/v.sec, with a donor concentration of $2 \times 10^{12}$ to $6 \times 10^{12}$ cm$^{-2}$.

The parasitic resistance within a FET between the source and gate, and gate and drain, depend on the low field mobility (i.e. as mobility decreases, parasitic resistance increases), thus high mobility is desirable. The HEMT, for example, has very low parasitic resistances due to the high carrier mobility; whereas a delta-doped FET has higher parasitic resistances due to the lower mobility. In order to reduce the parasitic resistances within a delta-doped FET, the gates are self aligned or a recessed gate structure is used. Thus, the adverse effects of parasitic resistance can be minimized.

BRIEF DESCRIPTION OF THE DRAWINGS

FIG. 1a is a cross sectional view of a conventional Delta-Doped FET.

FIG. 1b is a cross sectional view of one embodiment of the present Planar-Doped Valley FET.

FIG. 5 is a graph showing the PDVFET's power-added efficiency vs. frequency response.

DETAILED DESCRIPTION OF THE PREFERRED EMBODIMENT

The present invention is an improvement upon the delta-doped FET, in that the present invention uses more than a single delta-doped layer in order to achieve enhanced transistor performance. The present invention also has the above stated advantages over HEMT's, such as the use of a homo-structure, which makes the device of the present invention easier to manufacture with fewer opportunities for error.

Figures 2A, 2B, 2C:
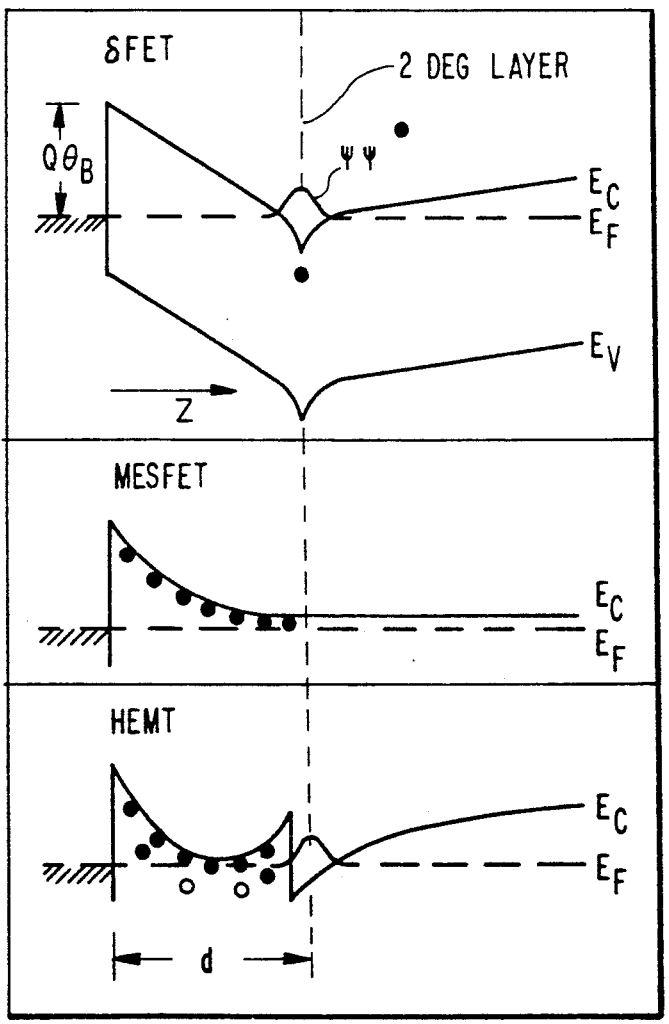
FIG. 2a is a schematic real-space energy-band diagram of a Delta-Doped FET.
FIG. 2b is a schematic real-space energy-band diagram of a MESFET.
FIG. 2c is a schematic real-space energy-band diagram of a High Electron Mobility Transistor.
Figure 3:
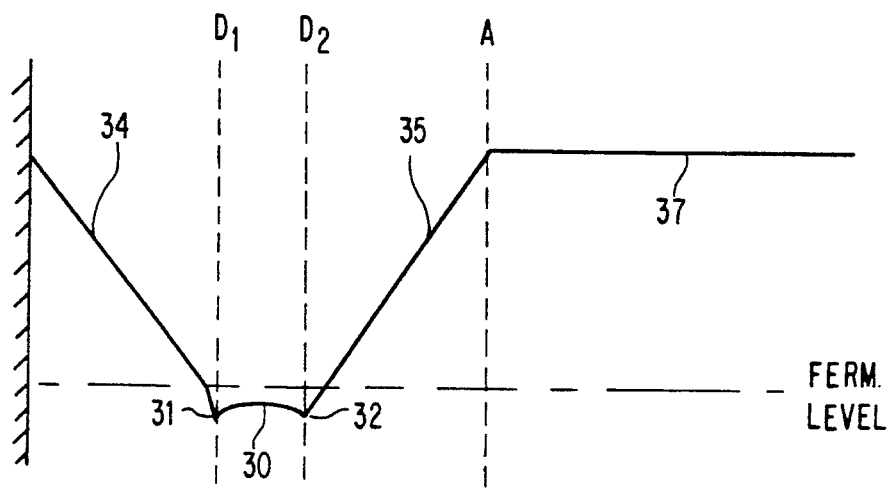
FIG. 3 is a schematic real-space energy-band diagram of one embodiment of the Planar-Doped Valley FET.

The PDVFET includes additional atomic planes (delta-layers), doped with either donors or acceptors, to adjust the shape of the conduction band valley (as shown in FIG. 3) to further improve the transport properties (i.e. carrier sheet concentration, mobility, saturation velocity, etc.). By including additional 2 delta-doped layers, the conduction band valley is widened beyond a single V-shaped quantum well (FIG. 2a), which provides a wider conduction channel and allows a larger portion of the electrons to operate within undoped material. This improves the transport properties while retaining the advantages discussed above with relation to the single layer delta-doped FET. A PDVFET can have as few as two, or as many more delta-doped layers as desired.

A PDVFET according the present invention is shown in FIG. 1b, which displays a PDVFET 11 with source 8, gate 9, and drain 10 contacts. This example of a PDVFET includes donor planes 1 and 2 (also referred to as donor layers), n-doped GaAs layers 4 and 5, un-doped GaAs layers 6 and 7, an acceptor plane 3 (also referred to as an acceptor layer), and a substrate 15. The donor and acceptor layers are also referred to as atomic plane layers. Layer 4 is designed to have a particular net donor concentration such that the width of the depletion layer due to the surface states on the GaAs surface 12 is exactly equal to the thickness of layer 4. The acceptor layer 3 is positioned below the second donor layer 2 with a n-doped GaAs layer between the donor and acceptor layers. In this example, the acceptor concentration within acceptor layer 3 is equal to the donor concentration within layer 2, in order to create a potential shift between the donor 2 and acceptor 3 layers of approximately half the band gap of the GaAs; however, other concentrations are acceptable so long as this potential shift remains below the GaAs band gap width. Because of their equal concentrations, layers 2 and 3 will mutually deplete one another (i.e. layer 3 will accept all of donor layer 2's free electrons), provided the potential shift there between remains less than the GaAs band gap. This mutual depletion is desirable in applications where the transconductance must remain as constant as possible. This is accomplished when the electrons are confined to a thin layer. Thus, during operation, electrical conduction occurs within and near donor layer 1, and within the undoped GaAs layer 6. Higher maximum drain currents can be obtained by increasing the donor concentration in layer 2, but not increasing the acceptor concentration in layer 3. This allows additional electrons to flow within and near layer 2, and makes the transconductance slightly less constant as the gate voltage is varied.

Donor layers 1 and 2 produce large potential gradients 34 and 35 (FIG. 3) along either side of the valley, which act to provide strong confinement characteristics, in order to restrict the electron movement to free energy states located within the valley bottom. Strong confinement prevents the conducting layer from increasing in thickness as the drain voltage increases, thus reducing the parasitic drain conductance of the device. In addition, by controlling the free electrons within the undoped GaAs layer, mobility can be maximized for carriers moving between and parallel to donor planes 1 and 2.

Figure 6:
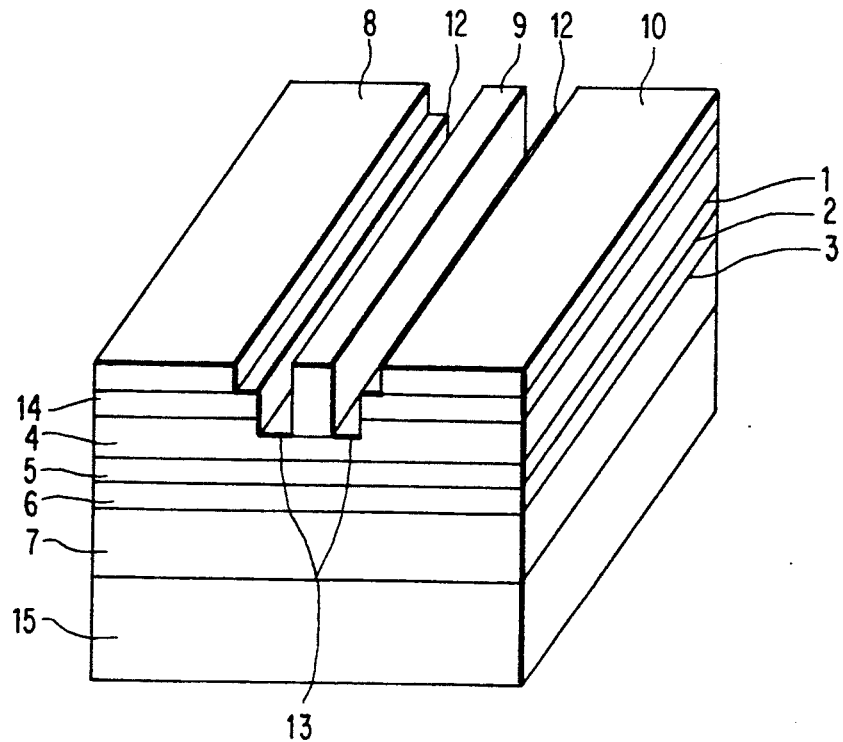
FIG. 6 is a perspective view of one embodiment of the present invention.

In order to assure a low resistance path between the ohmic contacts and the 2DEG, the region between donor plane 1 and the GaAs surface 12 can be doped with n-type donors having a concentration in the range of $2-6\times10^{17}$ cm$^{-3}$. Outside the ohmic metal contacts, the surface state depletion layer within layer 4 extends completely throughout this doped layer. Under the ohmic metal 8 and 10, there is no depletion layer so electrons can easily move through the doped layer to the contacts. In addition, as shown in FIG. 6, the gate could be recessed through a thin surface N+layer to further reduce parasitic resistance between the ohmic contacts and the conducting channel under the gate.

The high donor density within the donor layer 1 offers high power output, since this contributes a large number of free electrons to be dispersed throughout the conduction band valley bottom. The present PDVFET provides high gain and power output at millimeter-wave frequencies near 100 GHz, as does pseudomorphic HEMT. However, the PDVFET more closely achieves its theoretical performance than HEMT's, since the PDVFET's active channel is entirely GaAs. This homo-structure includes fewer critical variables to control while growing the epitaxial active layer, than a pseudomorphic HEMT, and therefore, desired layer doping concentrations are more closely achieved.

EXAMPLE 1:

The performance of the PDVFETS as power devices has been computed using a mathematical load-pull power FET model. The PDVFET design for modeling was chosen with the following parameters:

Donor layer 1 depth = 125 Angstroms below the gate;
Donor layer 1 density = $5\times10^{12}$cm$^{-2}$;
Donor layer 2 density = $1.66\times10^{12}$ cm$^{-2}$;
Acceptor layer 3 density = $1.66\times10^{12}$ cm$^{-2}$;
Mobility = 2600 cm$^2$/v sec;
Concentration of n-doped GaAs layer $4 = 5\times10^{17}$ cm$^{-3}$;

Modeling was done for gate lengths of, 0.3 and 0.1 microns and for frequencies from 10 to 140 GHz. The total gate length of 1 millimeter is divided among 20 gate fingers, each of which is 50 microns wide. The electron saturation velocity, for both gate lengths was $1.2\times10$; cm/sec.

Figure 4:
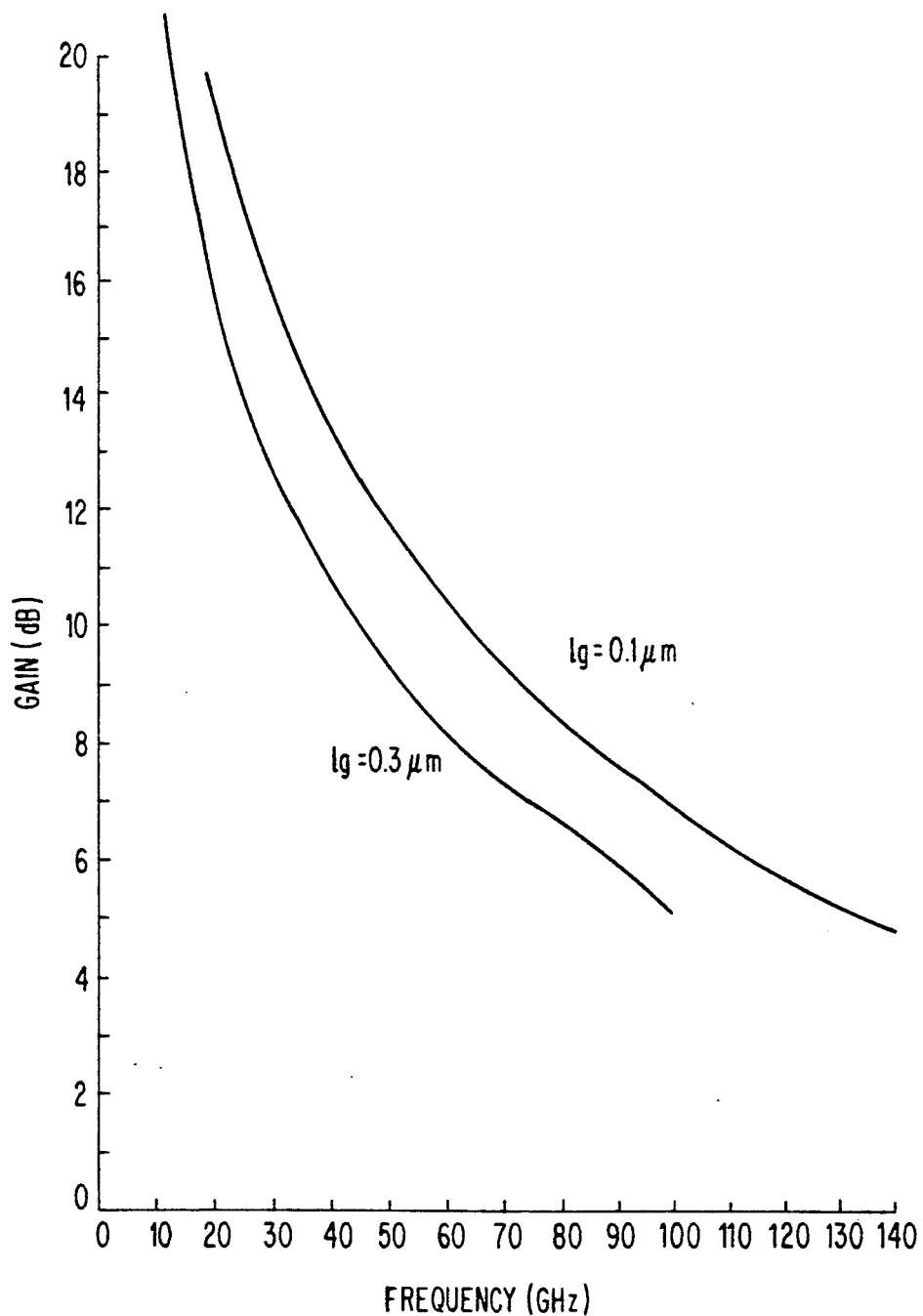
FIG. 4 is a graph showing the PDVFET's gain vs. frequency response.

The predicted power output, at 1 dB gain compression, for the 1-mm wide PDVFET is above 870 mW for the 0.1-micrometer gate length, and up to 936 mW for the 0.3-micrometer gate length. This high power is due to the high donor density in the donor plane 1. The maximum current of 583 mA is limited by a surface-state depletion layer with an equivalent "built-in" voltage of 0.4 V. The gate-drain breakdown voltage is 11.5 V. The gate-source pinch-off voltage is −0.23 V. FIGS. 4 and 5 show the associated gain vs frequency (the small-signal gain is 1 dB higher), and the associated power-added efficiency vs frequency curves. The curves are computed with a DC bias to maximize the power of linear class A transistor operation. The low pinch-off voltage, and high gain, over most of the frequency range would allow much higher efficiency for class B (or class AB) operation with only a small penalty in maximum power reduction.

The results show useful levels of gain and efficiency extending to 140 GHz for 0.1 micron gate lengths, and to 100 Ghz for 0.3-micron gate lengths. This is due to the short (125 Angstrom) distance between the conducting channel (donor layer 1) and the gate 9, which results in an internal transconductance of 1096 mS/mm. The external transconductance equals 536 mS/mm, which is lower than the internal transconductance because of parasitic resistance effects.

The source to gate, and gate to drain, parasitic resistances of 0.95 ohms could be reduced by recessing the gate (as shown in FIG. 6) through a thin N+ layer. This would also affect the maximum drain current and thus the gate-drain avalanche breakdown voltage. In addition, if the gate were recessed, the depth of donor layer 1 below the gate 9 and the recessed GaAs surface 13 is determined by the recess etching process which is often less accurate than the epitaxial growth process. In this recessed gate variation, there is a trade-off between yield vs improved performance due to the lower parasitic resistance. Layer 14 represents an N+ layer below the ohmic contacts.

The parasitic gate resistance is 1.25 ohms for the 0.1 micron gate length. A "mushroom" gate structure could be used to reduce this value, or the unit gate width could be halved and the number of fingers doubled to reduce the resistance by a factor of four. Such design changes could increase the gain by 2 dB, or more.

It should be noted that the present invention is not limited to 1 acceptor layer and 2 donor layers. Additionally, acceptor and donor layers could be included, dependent upon the desired energy band diagram.

Although the performance of the PDVFET is believed to be as good as or better than a p-HEMT, the PDVFET has an advantage besides performance, since the PDVFET is easier to prepare the materials for and fabricate.

Modifications can be formed without departing from the spirit and scope of this invention.

I claim:

1. A planar doped valley field effect transistor device, comprising:
    a semi-insulating substrate;
    a first doped or undoped layer formed above said semi-insulating substrate;
    a first atomic plane layer formed above said first doped or undoped layer, said atomic plane layer being doped with donor or acceptor atoms, wherein said first doped or undoped layer and said first atomic plane layer constitute a first layer pair;
    at least one additional layer pair, including an additional doped or undoped layer and an additional atomic plane layer, formed above said first layer pair, wherein said doped, undoped and atomic plane layers interact to create a potential well of a desired shape within an energy band diagram of said planar doped semiconductor in order for a two dimensional electron gas to exist therein, said energy band diagram having a wide conduction band wherein said potential well represents a portion of the conduction band which lies below a Fermi level and includes said first and additional atomic plane layers and any doped and undoped layers therebetween; and
    an upper doped or undoped layer formed above said at least one additional layer pair with source, drain, and gate electrodes formed thereon wherein said doped and undoped layers are formed from a single-crystalline homo-structure.

2. The planar doped valley field effect semiconductor device of claim 1, wherein at least one of said atomic plane layers is doped with donor atoms.

3. The planar doped valley field effect semiconductor device of claim 1, wherein at least one of said atomic plane layers is doped with acceptor atoms.

4. The planar doped valley field effect semiconductor device of claim 1, wherein at least one of said atomic plane layers is doped with acceptor atoms and at least one of said atomic plane layers is doped with donor atoms.

5. The planar doped valley field effect semiconductor device of claim 1, wherein said at least one additional layer pair includes second and third layer pairs with second and third atomic plane layers, respectively, said first atomic plane layer constituting an acceptor layer and said second and third atomic plane layers constituting donor layers.

6. The planar doped valley field effect semiconductor device of claim 1, wherein:
    said semi-insulating substrate is a GaAs substrate;
    said doped layers are n-doped GaAs layers, and said undoped layers are GaAs layers.

7. A planar doped valley field effect semiconductor device, comprising:
    a semi-insulating substrate;
    first and second undoped layers positioned above said semi-insulating substrate;
    first and second doped layers positioned above said first and second undoped layers, respectively;
    a first atomic donor plane positioned between said first doped and undoped layers;
    a first atomic acceptor plane positioned between said second doped and undoped layers, wherein said doped and undoped layers and said donor and acceptor planes interact to create a potential well within an energy band diagram of said planar doped semiconductor device in order for a two-dimensional electron gas to exist therein wherein said potential well corresponds to a portion of a conduction band of the energy band diagram below a Fermi level and includes said first and atomic donor and acceptor planes and any doped and undoped layers therebetween; and
    source, drain, and gate electrodes formed on said first doped layer, wherein said doped and undoped layers are formed from a single-crystalline homo-structure.

8. The planar doped valley field effect semiconductor device of claim 7, wherein:
    said semi-insulating substrate is a GaAs substrate;
    said first and second doped layers are n-doped GaAs layers, and said first and second undoped layers are GaAs layers.

9. The planar doped valley field effect semiconductor device of claim 7, further comprising:
    a second atomic donor plane located directly below and adjacent said first undoped layer and directly above said second doped layer.

10. The planar doped valley field effect semiconductor device of claim 7, wherein:
    said semi-insulating substrate is a GaAs substrate;
    said first and second doped layers are n-doped GaAs layers; and said first and second undoped layers are GaAs layers.

11. The planar doped valley field effect semiconductor device comprising:
    a semi-insulating substrate;
    a first undoped layer positioned above said semi-insulating substrate;
    a first doped layer positioned above said first undoped layer;
    an additional layer positioned between said first doped and undoped layers;

first and second atomic donor planes positioned upon either sides of said additional layer, wherein said first and second atomic donor planes and said doped, undoped, and additional layers interact to create a single potential well within an energy band diagram of said planar doped semiconductor device in order for a two-dimensional electron gas to exist therein, wherein said single potential well includes said first and second atomic donor planes and said additional layer positioned therebetween; and source, drain, and gate electrodes formed on said first doped layer, wherein said doped, undoped, and additional layers are formed from a single-crystalline homo-structure.

12. The planar doped valley field effect semiconductor device of claim 11, further comprising a second doped layer between said first undoped and additional layers, and an atomic acceptor plane positioned between said second doped layer and said first undoped layer, wherein said second doped layer and said atomic acceptor plane interact with said doped and undoped layers and said atomic donor planes to affect a shape of the potential well.

* * * * *